United States Patent [19]

Berger

[11] Patent Number: 4,498,019
[45] Date of Patent: Feb. 5, 1985

[54] SWITCHING CIRCUIT WITH A TIME DELAY DEVICE

[75] Inventor: Hermann Berger, Heidelberg, Fed. Rep. of Germany

[73] Assignee: Chemie Und Filter GmbH, Verfahrenstechnik KG, Heidelberg, Fed. Rep. of Germany

[21] Appl. No.: 500,268

[22] Filed: Jun. 2, 1983

[30] Foreign Application Priority Data

Jun. 5, 1982 [DE] Fed. Rep. of Germany ....... 3221364

[51] Int. Cl.³ ............................................. H01H 43/00
[52] U.S. Cl. ............................. 307/132 E; 307/141.4; 307/598; 361/195; 377/44
[58] Field of Search ............... 307/132 E, 141, 141.4, 307/592, 593, 597, 598; 328/131.1; 361/194, 195, 203; 377/44

[56] References Cited

U.S. PATENT DOCUMENTS

| 3,050,708 | 8/1962 | Alstyne et al. | 377/44 X |
| 3,950,657 | 4/1976 | Sheng et al. | 307/597 X |
| 4,260,912 | 4/1981 | Bjorke | 307/593 X |
| 4,344,000 | 8/1982 | Schornack et al. | 307/132 E |
| 4,354,747 | 10/1982 | Borowski et al. | 307/132 E X |

Primary Examiner—A. D. Pellinen
Assistant Examiner—Derek Jennings
Attorney, Agent, or Firm—Peter K. Kontler

[57] ABSTRACT

A switching circuit with a time-delay device comprises a pulse generator, and a counter which receives pulses therefrom. The overflow output of the counter transmits a counter signal after receiving a predetermined number of pulses. The counter is provided with a holding circuit for maintaining the counter signal up to the time of resetting and renewed start of the counting operation. The resetting input of the counter receives a signal either by way of an inverter or directly. The overflow output of the counter is connected with the output of the time delay device, either directly to obtain a delayed start or by way of an inverter to obtain a delayed termination.

4 Claims, 11 Drawing Figures

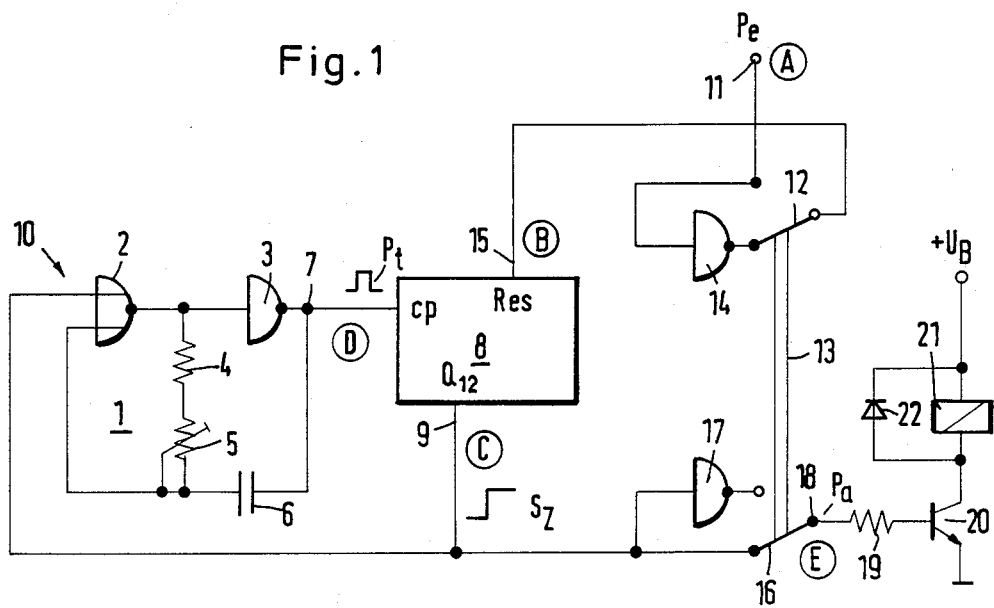
Fig. 1
| Fig. 2A | 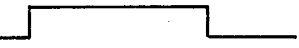 | Fig. 3A |  |
| Fig. 2B |  | Fig. 3B |  |
| Fig. 2C |  | Fig. 3C |  |
| Fig. 2D |  | Fig. 3D |  |
| Fig. 2E |  | Fig. 3E |  |

SWITCHING CIRCUIT WITH A TIME DELAY DEVICE

BACKGROUND OF THE INVENTION

The invention relates to a switching circuit with a time delay device the output signal of which actuates a load, such as a regulating device, with a delay relative to an input control signal.

Conventional switching arrangements of such character operate with electrical RC time delay devices. The timed intervals which are achievable with such conventional time delay deevices are rather limited because the RC timing network requires the use of very large capacitors for timing long intervals. Not only are large capacitors expensive and bulky but they have rather pronounced tolerances which lead to inaccuracy in timing. Such conventional switching arrangements using such RC time delay circuits are incapable of furnishing precisely and uniformly timed intervals in excess of one minute.

It is also known to equip or control switching elements with a bimetallic timing pulse generator. However, this entails substantial expenditures for the construction of such arrangement and requires a large amount of space. Moreover, the accuracy is unsatisfactory, response time is slow and operation of the timing feature is influenced by the environment in which the apparatus is operated.

OBJECTS AND SUMMARY OF THE INVENTION

An object of the invention is to provide a switching arrangement with delayed operating capability which is capable of repeatedly achieving switching functions after a precisely timed interval of considerable duration, with a high degree of accuracy and reliability and at low cost.

This object is accomplished by using a unique time delay arrangement in association with a switching device wherein the time delay circuit comprises a controlled pulse generator, and a counter which is boot strap connected to control the pulses of the generator and the overflow output of the counter. The controlled or shaped pulses of the pulse generator are applied to the counter which, after receiving and counting a predetermined number of pulses, provides an overflow output. The boot strap connection between the output of the counter and the input to the pulse generator comprises a holding circuit which aids in shaping the output pulses of the pulse generator and maintains the counter overflow output signal up to the time of reset and start up of the counting function. A control input signal is applied to the counter and, in accordance with the characteristic of such signal, the signal resets and holds or starts the count function. The counter overflow output signal is a timed interval signal which is applied to the load or switching circuit. Signal inverter capability in the control input circuit and the output to the load or switching circuit provides for alternately selectable modes of switching, such as a switch-on delay mode or a switch-off delay mode.

In the switch-on delay mode, commencement of the timed delay interval for switch-on delay is a function of the characteristics of the control input signal as applied to the counter via the signal inverter in the input circuit. The output signal from the counter overflow circuit as applied to the control junction is applied directly to the control junction, bypassing the signal inverter.

In the switch-off delay mode, commencement of the timed delay interval, for switch-off delay is a function of the characteristics of the control input signal as applied directly to the counter. The output signal from the counter overflow circuit may be applied to the control terminal via the signal inverter.

Thus, the same circuit arrangement can be used for switch-on delay functions and switch-off delay functions in accordance with the desires of the user.

Operation of the counter is a function of the characteristic of the signal as applied to the counter. When the signal goes, for example, from logic 0 to logic 1, the counter is reset. While the signal is held at logic 1, the counter is held inoperative. When the signal goes, for example, from logic 1 to logic 0, the counter starts counting pulses applied to it from the pulse generator. Thus, the interval is timed. When the counter counts a predetermined number of pulses, the counter provides an overflow output, thus indicating the timed period by the change in signal from logic 1 to logic 0.

By using signal inversion techniques in the control input circuit, the counter may be made to respond directly to the logic characteristics of the control input signal or may be made to respond to the inverse of the logic characteristics of the control input signal.

The pulse generator includes two NOR gates which serve to shape the pulse output of the generator. One NOR gate is connected across the resistors of the oscillator thereby receiving pulses from the generator. The output of the one gate is applied to the other NOR gate which inverts the input signal thereby enhancing and shaping the output pulse. A second input to the one NOR gate is from the overflow output of the counter. The signal, when applied as an input to the one NOR gate, converts the one NOR gate into a locking element which prevents transmission of the pulses to the counter and holds the counter in overflow status until reset. This preserves the integrity of the overflow signal, and therefore the integrity of the delayed output signal.

The novel features which are considered as characteristic of the invention are set forth in particular in the appended claims. The improved switching arrangement itself, however, both as to its construction and its mode of operation, together with additional features and advantages thereof, will be best understood upon perusal of the following detailed description of certain specific embodiments with reference to the accompanying drawings.

BRIEF DESCRIPTION OF THE DRAWINGS

FIG. 1 is a circuit diagram of one embodiment of a switching arrangement which is constructed and assembled in accordance with the present invention;

FIGS. 2A–2F represent pulse forms at indicated points in the circuit when the switching arrangement is in the switch-on delay mode of operation; and, FIGS. 3A–3E represent pulse forms at indicated points in the circuit when the switching arrangement is in the switch-off delay mode of operation.

DESCRIPTION OF THE PREFERRED EMBODIMENTS

A pulse generator 1, which is shown in FIG. 1, comprises two NOR gates 2 and 3, a fixed resistor 4, a variable resistor 5 and a capacitor 6. The output 7 of the pulse generator 1 transmits pulses Pt whose duration is a function of the setting of the RC network of the pulse generator 1.

The pulses Pt are applied from the pulse generator to a counter 8 at terminal cp as shaped pulses. After receiving a predetermined number of pulses Pt, as applied from terminal 7, the output 9 of the counter 8 transmits an overflow or counter output signal Sz. The counter 8 may be any pulse counter or count accumulator that receives pulses as an input or counts and/or accumulates such pulses and provides an overflow output upon having counted a predetermined number of pulses. Pulse shaping is provided by the inclusion of NOR gates 2 and 3. Internal pulses are applied to NOR gate 2, which is connected across the resistors 4 and 5, and the output of gate 2 is applied to the input of NOR gate 3, the output of which is connected to the pulse generating side of the capacitor 6.

The overflow output Sz of the counter 8 is also applied as a second input to NOR gate 2. This provides a holding circuit which locks the pulse generator to effectively prevent the transmission of pulses to the counter 8 when the overflow output is applied to to the NOR gate 2.

The input 11 of the time-delay device 10 can receive an input signal Pe which, through the medium of a contact 12 which forms part of a switchover device 13, is applied to the reset input 15 of the counter 8 either by way of an inverter 14 or directly. A second contact 16 of the switchover device 13 can selectively transmit the output signal Sz from the counter 8 to the output 18 of the time-delay circuit directly or by way of an inverter 17.

The output 18 is connected to the control input of connected to a load, represented as a switching element 20, by way of a resistor 19. The illustrated switching element 20 is a transistor which is connected in series with a regulating relay 21 and a source of operating voltage $U_B$. The relay 21 is bypassed by a recovery diode 22. For example, the relay 21 can regulate the operation of a metering pump which supplies an additive to a fluid, e.g., a pH-varying additive to a liquid medium.

In the illustrated position of the switch mode selecting device 13, the circuit of the present invention is set in the switch-on delay mode as represented by v in FIG. 2. The pulses or signals which are shown in FIGS. 2A–2E are generated or applied at the respective encircled locations A, B, C, D and E which are shown in FIG. 1. The input signal Pe at the location A may, for example, be logic 1 or logic 0 and is inverted by 14. In its inverted form, the signal is transmitted to the reset input 15 of the counter 8 at B. As shown in FIGS. 2 and 3, when the signal applied at 15 (or B) goes from logic 0 to logic 1 the counter 8 resets. The counting operation by the counter 8 is started when the signal applied at 15 (or B) goes from logic 1 to logic 0. The overflow signal Sz at the output 9 of the counter 8 appears at the location C with a delay v. At the same time, the pulse generator 1 is blocked by the circuit 10. The output signal Pa at the locus E is identical with the signal Sz.

FIGS. 3A–3E represent pulses provided at the respective terminals A, B, C, D and E when the switch mode selector 13 is moved into its alternate position, for providing the switch-off delay mode of operation as represented by V in FIG. 3C. For purposes of simplification, the terms "logic 0" and "logic 1" are used to represent characteristics of the signals.

The contacts 12 and 16 of the switch mode selector 13 would be respectively positioned so that the control input signal Pe is transmitted directly to the counter 8 at terminal 15, while the output signal Sz of the counter 8 is transmitted to the terminal 18 via the inverter 17. In this instance, the signal at B follows the signal at A directly so that, when signal A (and therefore B) goes from logic 0 to logic 1, the counter 8 is reset. When signal A (and therefore B) goes from logic 1 to logic 0, the counter 8 starts to count pulses for timing an interval. At any time during timing of the interval, the control input signal may change from logic 0 to logic 1 and reset the counter 8 thereby interrupting and stopping the timing of the interval.

When the counter 8 increments to the desired count, the overflow output Sz at C goes from logic 0 to logic 1. This logic 1 overflow signal is applied to the NOR gate 2 which inverts the signal and applies this inverted signal (logic 0) to the NOR gate 3. NOR gate 3 inverts its input signal from logic 0 to logic 1 as seen in FIGS. 2D and 3D. This overcomes the pulses Pt and effectively prevents transmission of the pulses Pt to the counter 8 while holding the counter 8 in overflow status. Thus the counter 8 is prevented from incrementing and is held at the final count. The integrity of the overflow signal is thus preserved.

As is well known in the art, many of the elements of the illustrated circuit can be assembled into an integrated circuit. The counter 8 may be an off the shelf module commercially identified as type CD 4040, which is adapted to receives pulses and generate an overflow output signal such as represented by Sz, after incrementing 2048 times in response to pulses such as represented by Pt. If, when practicing the present invention, the resistance of the resistor 4 is 17k ohms, and if the capacity of the capacitor 6 is 15 nF, one can obtain a time delay of between 2 and 34 seconds. If the capacity of the capacitor 6 is 0.1 nF, the time delay is between 15 and 256 seconds. If the capacity of the capacitor 6 is 0.22 nF, the delay is between 32 and 553 seconds, and the delay is between 154 and 2457 seconds (i.e., in excess of 40 minutes) if the capacity of the capacitor 6 is 1 nF.

An example of use of the present invention can be found in the control of admission of additives to a liquid which is to be maintained at a specific pH and has its chemical composition monitored. The signal that denotes the monitored value may be the input control signal Pe. The purpose of the switch-on delay mode may be to avoid initiation of introduction of an additive or a regenerating fluid in response to short lasting deviations or fluctuations in chemical composition as monitored by a monitor and expressed in the characteristics of the input control signal.

The switch-off delay mode may be used, for example, if the desired maximum value is reached or exceeded only for a short interval of time in the course of a regenerating operation.

As indicated by the variable resistance 5, the duration of the timed delay v or V may be changed at any time, even during the counting operation, by changing the resistance of the resistor 5 and thus the resistance of the resistor network. This would simply change the frequency of the pulse generator.

One embodiment of the invention has been shown and described relative to two modes of operation. Other embodiments of the invention may be employed, as will be obvious to those skilled in the art, without departing from the spirit of the invention as defined in the claims.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning and range of equivalence of the claims.

Wherefore, I claim:

1. A switching circuit having a time delay device whose output signal actuates a load element with a delay relative to an input control signal arriving from input means, the time delay device comprising:
   a pulse generator,
   a pulse counter having a counter input which receives pulses from the pulse generator, the pulse counter further having an output which is arranged to transmit a counter output signal after the counter input receives a predetermined number of pulses, and the pulse counter also having a resetting input which receives the input control signal,
   a holding circuit for maintaining the counter output signal up to the time of resetting and renewed start of the counting operation,
   an inverting device for the input control signal,
   a signal inverter for the counter output signal, and
   a switch mode selection device arranged to assume first and second positions, the switch mode selection device including a first contact which connects the resetting input of the pulse counter with an output of the inverting device in the first position and, in the second position, connects the resetting input directly with the input means, the switch mode selection device further including a second contact which connects the output of the pulse counter directly with a control input of the load element in the first position and, in the second position, connects the output of the pulse counter with the control input through the signal inverter.

2. Switching circuit according to claim 1 wherein the holding circuit comprises a locking element which is controlled by the counter output signal and prevents the transmission of timing pulses.

3. Switching circuit according to claim 2, wherein the pulse generator comprises a NOR gate having a first input which is connected with the remaining parts of the pulse generator, and a second input which is connected with the output of the counter.

4. A switching circuit in which the switching function is controlled by an output signal of a time delay circuit, the output signal being delayed by a predetermined time interval relative to an input control signal, and the time delay circuit comprising:
   a pulse generator for generating a sequence of pulses at a predetermined rate, the pulse generator including first and second gates for shaping the pulses,
   a pulse counter for counting a predetermined number of pulses and thereupon generating a counter output signal,
   means for transmitting the shaped pulses to the pulse counter,
   means for transmitting the counter output signal to a control input of the switching circuit for controlling the switching function,
   means for transmitting the counter output signal to the first gate of the pulse generator so as to lock the pulse generator and prevent transmission of the shaped pulses to the pulse counter,
   input means for supplying the input control signal to the pulse counter, the input control signal having at least a first predetermined characteristic and a second predetermined characteristic, and
   means selectively insertable into the input means for changing the first predetermined characteristic of the input control signal into the second predetermined characteristic.

* * * * *